United States Patent [19]

Littlebury et al.

[11] Patent Number: 5,177,438
[45] Date of Patent: Jan. 5, 1993

[54] LOW RESISTANCE PROBE FOR SEMICONDUCTOR

[75] Inventors: Hugh W. Littlebury, Chandler; Marion I. Simmons, Tempe, both of Ariz.

[73] Assignee: Motorola, Inc., Schaumburg, Ill.

[21] Appl. No.: 739,576

[22] Filed: Aug. 2, 1991

[51] Int. Cl.⁵ .......................... G01R 1/00; G01R 1/04
[52] U.S. Cl. .......................... 324/158 P; 324/158 F; 324/72.5
[58] Field of Search ............... 324/158 F, 158 P, 73.1, 324/72.5; 439/482; 437/8; 29/827, 825

[56] References Cited

U.S. PATENT DOCUMENTS

| | | | |
|---|---|---|---|
| 4,571,542 | 2/1986 | Arai | 324/158 P |
| 4,820,976 | 4/1989 | Brown | 324/158 P |
| 4,849,689 | 7/1989 | Gleason et al. | 324/158 P |
| 5,090,118 | 2/1992 | Kwon et al. | 324/158 P |
| 5,128,612 | 7/1992 | Aton et al. | 324/158 F |

Primary Examiner—Vinh Nguyen
Attorney, Agent, or Firm—Joe E. Barbee

[57] ABSTRACT

A probe (10) that can be used for forming a low resistance electrical connection to a semiconductor die includes a contact (18) that is created on a compliant layer (12) which is supported by a substrate (11). Pressure applied to the contact (18) compresses the compliant layer (11) which causes a distal end of the contact (18) to move in a motion that is substantially equal to an arc. As the contact (18) moves through the arc motion, it scrubs across a bonding pad of a semiconductor die and breaks through oxide that typically forms on the bonding pad thereby forming a low resistance electrical connection to the bonding pad.

18 Claims, 2 Drawing Sheets

LOW RESISTANCE PROBE FOR SEMICONDUCTOR

BACKGROUND OF THE INVENTION

The present invention relates, in general, to testing semiconductors, and more particularly, to a novel probe that is used for forming a low resistance electrical connection to a semiconductor die.

In the past, the semiconductor industry had used burn-in to assist in improving the quality of semiconductor devices. In most cases, burn-in was limited to packaged semiconductor devices because it was difficult to perform testing of individual semiconductor die or semiconductor wafers. As semiconductor packaging costs increased and semiconductor technology produced greater levels of integration, the need to burn-in and test individual semiconductor die and semiconductor wafers increased. In most cases, burn-in of semiconductor devices was performed at temperatures of up to 130° centigrade. After a period of time, typically after 24 to 48 hours, testing would be performed to detect failures that had occurred. In some cases, the testing was also performed at elevated temperatures.

One disadvantage of prior methods of testing semiconductor wafers or individual die during or after burn-in was the difficulty in forming low resistance connections. Generally, the probe pads of a semiconductor die were exposed during burn-in. Consequently, the conductor material that was used for the semiconductor's probe pad or bonding pad oxidized thereby forming an electrical barrier that prevented making low resistance contact to the semiconductor die.

Another disadvantage of prior methods for forming connections to semiconductors during burn-in was maintaining electrical connection to the semiconductor die's bonding pads. The elevated temperatures encountered during burn-in operations caused semiconductor die to expand. Since the coefficient of thermal expansion of prior contact devices did not match that of silicon, the die and the contact expanded at different rates which made it extremely difficult to maintain alignment between the semiconductor die's bonding pad and the probe or contact device.

Accordingly, it is desirable to have a contact or probe that can form a low resistance connection to the bonding pad of a semiconductor die, and that has a coefficient of thermal expansion that essentially matches that of silicon.

SUMMARY OF THE INVENTION

Briefly stated, the present invention is achieved by creating a contact on a compliant layer that is supported by a substrate. Pressure applied to the contact compresses the compliant layer which causes a distal end of the contact to move in a motion that is substantially equal to an arc. As the contact moves through the arc motion, it scrubs across a bonding pad of a semiconductor die and breaks through oxide that typically forms on the bonding pad.

DETAILED DESCRIPTION OF THE DRAWINGS

Figure 1:
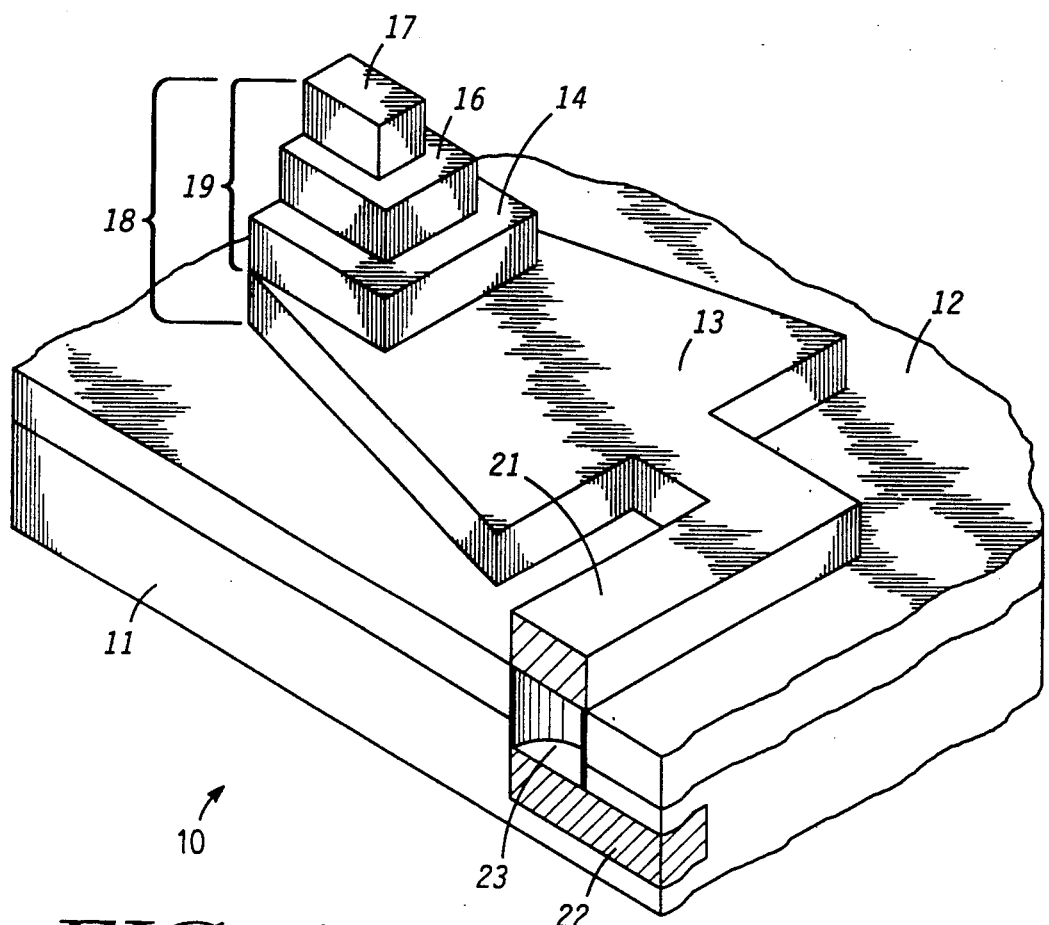
FIG. 1 is an enlarged prespective view of an embodiment of a probe in accordance with the present invention.

FIG. 1 illustrates an embodiment of a probe 10 that is capable of providing a low resistance connection to a semiconductor die. Probe 10 includes a plurality of conductor layers 13, 14, 16, and 17 that form a contact 18 and a contact tip 19 which can form a low resistance electrical connection to a semiconductor die (not shown). Contact 18 is supported by a compliant layer 12 that has been formed on a substrate 11. In most cases, a plurality of contacts 18 are positioned in a pattern that matches the bonding pads of a semiconductor die wherein each contact 18 is aligned to a bonding pad of the die. Compliant layer 12 is a resilient material that compresses or yields under pressures that are applied by contact 18 as tip 19 is pressed against the semiconductor die. As compliant layer 12 compresses, the distal end or layer 17 of tip 19 moves across the bonding pad and scrubs through the oxide layer that has formed on the bonding pad. This scrubbing movement facilitates forming a low resistance connection between contact 18 and the bonding pad of the semiconductor die.

In addition to being compliant, the material used for compliant layer 12 should also be capable of withstanding the temperatures encountered during the burn-in of semiconductors, up to approximately 130° centigrade. High temperature polyimide, and high temperature polyurethane are two general categories of materials that are suitable for complaint layer 12. High temperature polyimide is known under such brand names as Kapton and Kapton type E manufactured by E.I. DuPont De Nemours corporation of Wilmington, Del. as well as Upilax manufactured by Ube Industries corporation of New York City, N.Y. The size of compliant layer 12 may be just large enough to provide a means for absorbing the pressure applied by contact 18 or it may cover the surface of substrate 11. In the preferred embodiment, compliant layer 12 is high temperature polyimide that has a thickness between approximately fifty and seventy microns.

Substrate 11 is a material that provides a rigid support for compliant layer 12. The rigidity is necessary to ensure that the deformation of compliant layer 12 is localized to a small area. Localizing the deformation is important to ensuring that the distal end of tip 19 moves in an arc-like motion and scrubs across the bonding pad that tip 19 is pressed against. Generally, substrate 11 is a circuit board which includes, in addition to contact 18, electrical circuitry such as driver and receiver circuits, and interconnects between the electrical circuitry and contact 18. Since probe 10 will be used at elevated temperatures, it is important that the material used for substrate 11 have a coefficient of thermal expansion that approximately matches the coefficient of thermal expansion for silicon. If there is a large difference between the two coefficients of expansion, the position of contact 18 may not match the position of the bonding pad on the semiconductor die. In the preferred embodiment, substrate 11 is formed from multiple layers of aluminum nitride since aluminum nitride's coefficient of thermal expansion closely matches that of silicon. Matching the thermal expansion rate of probe 10 to that of silicon assists in maintaining alignment to a semiconductor die, and is a significant improvement over prior methods of forming electrical connection to a semiconductor die. Other suitable materials that can be used for substrate 11 include printed circuit boards that utilize quartz, kevlar or other similar reinforcing fibers.

Contact 18 includes a base plate 13 which forms a support for tip 19. Tip 19 can have a variety of shapes, as will be seen hereinafter in FIG. 3. It is important for tip 19 to be positioned so that pressure is applied primarily along one edge of base plate 13. One particular arrangement is to eccentrically position tip 19 on base plate 13 with tip 19 extending perpendicular to base plate 13. Base plate 13 is formed from a ductile conductor material such as aluminum or copper so that pressure applied to tip 19 will bend a portion of base plate 13 into compliant layer 12 as will be seen hereinafter in FIG. 2. Since cap 17 forms an electrical connection by scrubbing across a bonding pad of a semiconductor die, it is important to form cap 17 from a material that is wear resistant and does not develop an oxide layer that could become an electrical barrier. One example of suitable materials for cap 17 is the noble metals such as rhodium, gold alloys, platinum, or palladium.

In the preferred embodiment, base plate 13 is a trapezoidal-shaped section of copper that has been applied to compliant layer 12. The trapezoid's long side is approximately 100 microns long and is about 100 microns from the shorter side. In this embodiment, tip 19 has a stair-shaped structure that is created by forming each of first step 14, second step 16, and cap 17 progressively smaller than the preceding stair so that all of the stair elements have one edge aligned to one common edge of base plate 13. First step 14 and second step 16 are square-shaped sections of copper that have been successively applied by evaporation, sputtering or other similar deposition techniques. Cap 17 is a square-shaped layer of rhodium since rhodium is one of the hardest of the noble metals.

Typically, substrate 11 includes a signal line 21 that connects base plate 13 to other circuitry that is on substrate 11. Signal line 21 is generally connected to an edge of base plate 13 that is opposite tip 19. Signal line 21 is connected to driver or receiver circuits (not shown) located on other portions of substrate 11 wherein these driver or receiver circuits provide signals to or receive signals from a semiconductor die (not shown) that is electrically connected to probe 10. In some cases, substrate 11 has embedded signal layers such as a signal layer 22 that connects signal line 21 to the driver and receiver circuits by a plated-through-hole or via 23.

Figure 2:
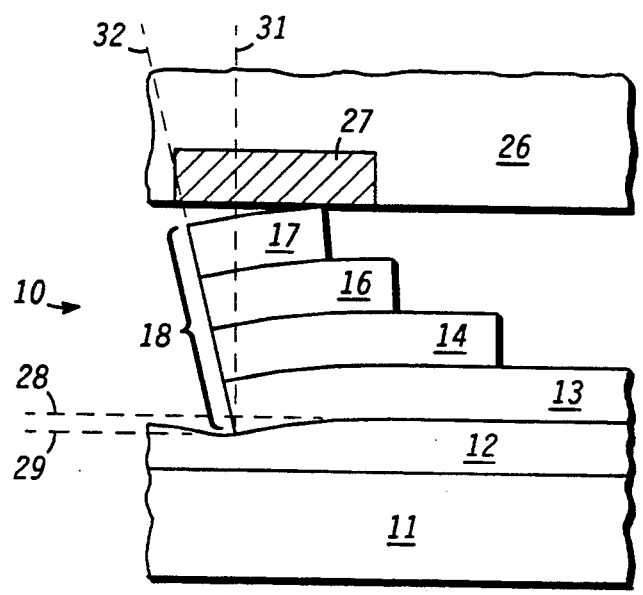
FIG. 2 illustrates the probe of FIG. 1 forming electrical connection to a semiconductor die in accordance with the present invention.

FIG. 2 illustrates a side view of probe 10, shown in FIG. 1, forming an electrical connection to a bonding pad 27 that is on a semiconductor die 26. Elements of probe 10 which are identical to the elements shown in FIG. 1 are identified by the same reference numerals. A portion of die 26 near bonding pad 27 is shown as inverted and pressed against probe 10. Pressure applied to cap 17 is transmitted through contact 18 to an edge of base plate 13 thereby bending base plate 13 and pressing a portion of base plate 13 into compliant layer 12. As base plate 13 bends, the distal end of contact 18 is caused to move with a motion that is substantially equal to the shape of an arc. During the arc-like movement, cap 17 moves across or scrubs bonding pad 27. This scrubbing removes any oxide that is between bonding pad 27 and contact 18, and permits contact 18 to form a low resistance connection to the bonding pad. The distance that base plate 13 bends or deflects from the original plane of base plate 13 is small in comparison to the total height of contact 18. The original horizontal position of the bottom of contact 18 before contacting bonding pad 27 is illustrated by a dashed line 28, while the position after contacting bonding pad 27 and compressing compliant layer 12 is illustrated by a dashed line 29. The distance between dashed lines 28 and 29 is the distance contact 18 is deflected or the deflection. Similarly, a dashed line 31 represents the original vertical plane of one edge of contact 18, while a dashed line 32 represents the plane after compressing compliant layer 12. The distance between dashed lines 31 and 32 measured at the top of cap 17 represents the distance contact 18 moves across pad 27 or the scrub. The angle between dashed lines 31 and 32 represents the bend angle.

By way of example, a contact 18 that is approximately 100 microns high and approximately 100 microns long may have a bend angle of approximately 2°. For such a bend angle, contact 18 has a scrub of between approximately three and four microns, and a deflection that is also between approximately three and four microns. Thus sufficient scrubbing action is provided by the two degree movement to break through any oxide that is between cap 17 and bonding pad 27. Consequently, probe 10 provides a low resistance electrical connection to bonding pad 27.

Figure 3A:
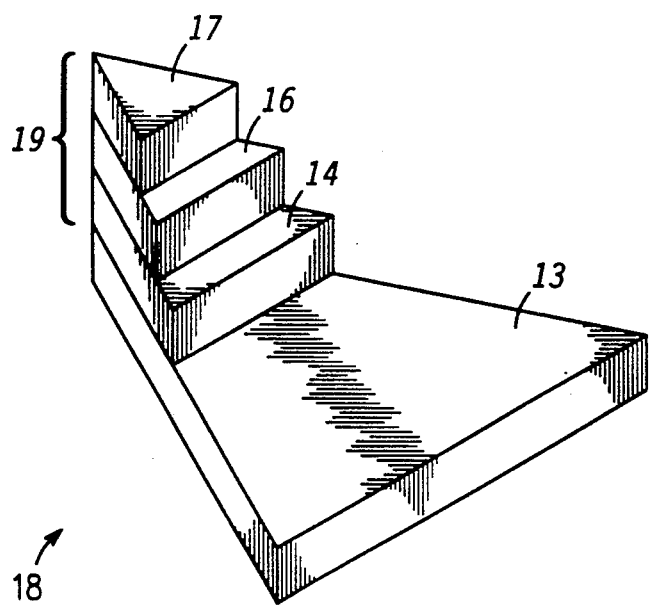
FIG. 3A is an enlarged view of an alternate embodiment of a contact in accordance with the present invention.
Figure 3B:
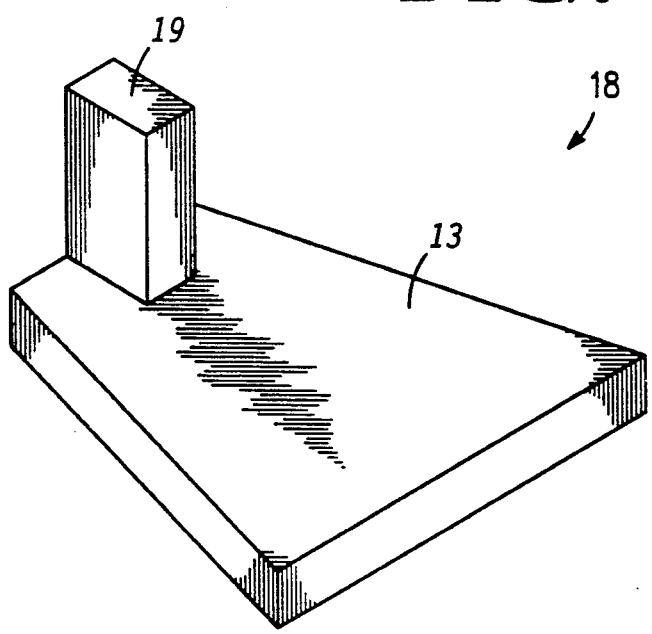
FIG. 3B is an enlarged view of an another embodiment of a contact in accordance with the present invention.

FIG. 3A and FIG. 3B illustrate alternate embodiments of contact 18 that is illustrated in FIG. 1. Elements of FIG. 3A and FIG. 3B that are the same as elements in FIG. 1 have the same reference numerals. FIG. 3A illustrates a triangular-shaped contact 18 that has a triangular shaped base plate 13, first step 14, and second step 16 along with a triangular-shaped cap layer 17. The vertex of step 14, step 16, and cap 17 are aligned to the vertex of base plate 13.

FIG. 3B illustrates an example of a simplified embodiment for contact 18 that includes a trapezoidal-shaped base plate 13 a single projection for tip 19. It should be noted that base plate 3 can have other shapes, such as a square or a rectangle. For each base plate 13, it is important that tip 19 be eccentrically positioned on base plate 13 in order to form a non-symmetric structure that applies pressure along one edge of base plate 13.

By now it should be appreciated that there has been provided a novel probe that forms a low resistance electrical connection to a semiconductor die or wafer. The probe is formed on a substrate that has a coefficient of thermal expansion that substantially matches that of silicon. Consequently, alignment between the bonding pads of the semiconductor die and the probe is maintained as the temperature varies. The probe is formed on a complaint layer that compresses in order to scrub the probe against the bonding pad. The inherent scrub motion of the probe structure scrubs through the oxide that forms on the bonding pad and provides a low resistance connection to the semiconductor die.

We claim:

1. A probe for providing a low resistance electrical connection to a semiconductor die comprising:

a rigid substrate that is a printed circuit board having electrical components interconnected on the substrate;

a compliant material covering a portion of the substrate;

a base plate covering a portion of the compliant material wherein the base plate is a trapezoidal shaped conductor that has a first edge that is a long edge, a second edge that is shorter than the first edge and is positioned opposite from the first edge;

a first step conductor layer that covers a portion of the base plate wherein the first step layer has an edge that is aligned with the second edge of the base plate;

a second step conductor layer that covers a portion of the first step layer and has an edge aligned with the second edge of the base plate;

a third step noble metal layer that covers a portion of the second step layer and has an edge aligned with the second edge of the base plate; and a signal line on the compliant material wherein the signal line is a conductor that forms an electrical connection to the first edge of the base plate.

2. The probe of claim 1 wherein the base plate, the first step layer and the second step layer are a ductile conductor material.

3. The probed of claim 1 wherein the base plate, the first step layer and the second step layer are copper.

4. The probe of claim 1 wherein the substrate is aluminum nitride.

5. The probe of claim 1 wherein the compliant material is a high temperature polymide.

6. The probe of claim 1 wherein the compliant material is a high temperature polyurethane.

7. The probe of claim 1 wherein the first edge of the base plate is approximately one hundred microns long.

8. A probe that is used to provide a low resistance electrical connection to a semiconductor die comprising:

a rigid substrate;

a base plate having a first surface, a second surface, and a first edge wherein the base plate is a ductile conductor material;

a tip projecting perpendicular from the first surface of the base plate and aligned to the first edge of the base plate wherein the tip is a conductor material; and a compliant material covering a portion of the substrate between the second surface of the base plate and the substrate wherein the compliant material compresses under pressure applied by the base plate to allow the base plate to bend which causes a distal end of the tip to move in a pattern that is substantially an arc in order to scrub the distal end of the tip across a bonding pad that is in contact with the distal end of the tip.

9. The probe of claim 8 wherein the base plate has a square shape.

10. The probe of claim 8 wherein the base plate has a triangular shape.

11. The probe of claim 8 wherein the ductile conductor material is aluminum.

12. The probe of claim 8 wherein the substrate is a printed circuit board.

13. The probe of claim 8 wherein the compliant material is a high temperature polyimide.

14. The probe of claim 8 wherein the compliant material has a thickness between fifty and seventy microns.

15. A probe that is used to provide a low resistance electrical connection to a semiconductor die comprising:

a rigid substrate;

a base plate having a first surface, a second surface, and a first edge wherein the base plate is a ductile conductor material;

a tip projecting perpendicular from the first surface of the base plate and aligned to the first edge of the base plate wherein the tip is formed from a plurality of layers of conductor material that are formed in a stair step shape; and a compliant material covering a portion of the substrate between the second surface of the base plate and the substrate wherein the compliant material compresses under pressure applied by the base plate to allow the base plate to bend which causes a distal end of the tip to move in a pattern that is substantially an arc.

16. A method of forming a low resistance probe comprising:

providing a substrate;

covering a portion of the substrate with a compliant layer;

covering a portion of the compliant layer with a base plate; and forming a tip projecting perpendicularly from the base plate wherein the tip is eccentrically positioned on the base plate for the purpose of causing a portion of the base plate to move into a plane of the compliant material which causes a distal end of the tip to move in a substantially arc-type motion for scrubbing the distal end of the tip across a bonding pad that is in contact with the distal end of the tip.

17. The method of claim 16 wherein covering the portion of the compliant layer with the base plate includes applying a ductile conductor onto the portion of the compliant layer.

18. A method of forming a low resistance probe comprising:

providing a substrate;

covering a portion of the substrate with a compliant layer;

covering a portion of the compliant layer with a base plate; and forming a tip by depositing a plurality of conductor layers on the base plate with each successive layer covering a smaller area thereby forming a tip that is wider at an end proximal to the base plate than at a distal end wherein the tip is eccentrically positioned on the base plate for the purpose of causing a portion of the base plate to move into the plane of the compliant material which causes a distal end of the tip to move in a substantially arc-type motion.

* * * * *

UNITED STATES PATENT AND TRADEMARK OFFICE
CERTIFICATE OF CORRECTION

PATENT NO. : 5,177,438
DATED : January 5, 1993
INVENTOR(S) : Hugh W. Littlebury and Marion I. Simmons It is certified that error appears in the above-indentified patent and that said Letters Patent is hereby corrected as shown below:

In column 5, claim 3, line 27, delete the word "probed" and insert therefor --probe--.

Signed and Sealed this

Twenty-third Day of August, 1994

Attest:

BRUCE LEHMAN

*Attesting Officer*  *Commissioner of Patents and Trademarks*